United States Patent [19]

Amemiya et al.

[11] Patent Number: 5,093,579
[45] Date of Patent: Mar. 3, 1992

[54] EXPOSURE APPARATUS WITH A SUBSTRATE HOLDING MECHANISM

[75] Inventors: Mitsuaki Amemiya; Shinichi Hara, both of Atsugi; Eiji Sakamoto, Sagamihara, all of Japan

[73] Assignee: Canon Kabushiki Kaisha, Tokyo, Japan

[21] Appl. No.: 550,989

[22] Filed: Jul. 11, 1990

[30] Foreign Application Priority Data

Jul. 13, 1989 [JP] Japan .................. 1-179167

[51] Int. Cl.$^5$ ............................................. G21K 5/08
[52] U.S. Cl. .............................. 250/453.1; 250/440.1; 250/441.1
[58] Field of Search ................ 250/453.1, 454.1, 440.1, 250/441.1, 443.1, 492.1, 492.2

[56] References Cited

U.S. PATENT DOCUMENTS

| | | |
|---|---|---|
| 4,194,233 | 3/1980 | Jones et al. .................... 361/233 |
| 4,383,178 | 5/1983 | Shibata et al. ................. 250/441.1 |
| 4,498,833 | 2/1985 | Hertel ............................ 250/492.2 |
| 4,503,335 | 3/1985 | Takahashi ...................... 250/548 |
| 4,786,947 | 11/1988 | Kosugi et al. .................. 355/30 |
| 4,852,133 | 7/1989 | Ikeda et al. .................... 378/34 |
| 4,888,488 | 12/1989 | Miyake ........................... 250/492.1 |
| 4,900,938 | 2/1990 | Suzuki et al. .................. 250/492.1 |
| 4,969,168 | 11/1990 | Sakamoto et al. ............. 250/440.1 |

FOREIGN PATENT DOCUMENTS

| | | |
|---|---|---|
| 0250064 | 12/1987 | European Pat. Off. . |
| 0260150 | 3/1988 | European Pat. Off. . |
| 0320297 | 6/1989 | European Pat. Off. . |
| 1534450 | 8/1977 | United Kingdom . |

Primary Examiner—Jack I. Berman
Assistant Examiner—Kiet T. Nguyen
Attorney, Agent, or Firm—Fitzpatrick, Cella, Harper & Scinto

[57] ABSTRACT

A substrate holding device includes a holding table having a reduced pressure passageway; a pressure gauge for measuring a value related to the pressure in the reduced pressure passageway; a pump for producing a pressure difference between a first surface of the substrate to be attracted to the holding table and a second surface of the substrate not to be attracted to the holding table; a valve which can be opened/closed for control of the pressure in the reduced pressure passageway; a pressure control system for controlling the opening/closing of the valve on the basis of an output corresponding to the value measured by the pressure gauge; and a temperature control system for controlling the temperature of the holding table.

16 Claims, 4 Drawing Sheets

CONTACT HEAT RESISTANCE OF Si AND SUS

EXPOSURE APPARATUS WITH A SUBSTRATE HOLDING MECHANISM

FIELD OF THE INVENTION AND RELATED ART

This invention relates to a substrate holding device for holding a substrate on a predetermined holding surface, through a difference between pressures respectively applied to a surface of the substrate, facing the holding surface, and another surface of the substrate remote from the holding surface. In another aspect, the invention is concerned with an exposure apparatus for manufacture of semiconductor microcircuit devices, having such a substrate holding device for holding a semiconductor wafer at a predetermined exposure position.

In the field of manufacture of semiconductor microcircuits, as such a substrate holding device, a vacuum chuck is known wherein a semiconductor wafer is held through a difference between pressures applied respectively to both sides of the semiconductor wafer. Also, proposals have been made to control the temperature of a wafer chuck, holding a semiconductor wafer at an exposure position in an exposure apparatus, thereby to control the temperature of the wafer so as to prevent expansion/contraction of the wafer resulting from changes in temperature of the wafer during the exposure operation or to correct distortion of the wafer caused by any other process.

Figure 5:
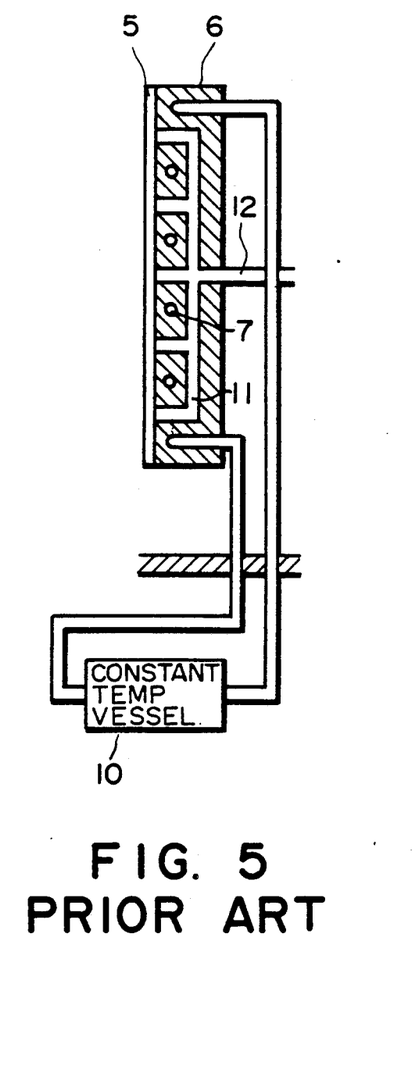
FIG. 5 is a schematic view showing the structure of a known type wafer chuck.

An example is illustrated in FIG. 5, wherein a wafer chuck 6 is arranged to hold a wafer 5 by a vacuum applied thereto through an evacuation passageway 12 and wherein the wafer chuck 6 is formed with a flow passageway 7 through which temperature controlled circulating water flows to perform temperature control of the wafer 5.

In X-ray lithography for manufacture of microcircuits, a mask and a wafer are disposed close to each other with a clearance on an order of a few tens of microns. Thus, the temperature of the mask easily follows the temperature of the wafer and, therefore, temperature rise in the wafer easily produces thermal distortion of the mask. This necessitates exact temperature control of the wafer, as compared with conventional lithography using light other than X-rays. In this respect, a vacuum applying system such as shown in FIG. 5 wherein a vacuum is simply or uncontrollably applied to the back of the wafer is not desirable. This is because mere application of a vacuum through a vacuum pump or the like substantially completely removes gas inside of the wafer chuck and in the interspace between the wafer and the wafer chuck, wherein such gas serves as a heat transfer medium. This easily results in an increase in the contact thermal resistance between the wafer and the wafer chuck. In this regard, experiments were performed wherein a wafer chuck made of an SUS material was used and, by using a vacuum pump, a vacuum was applied to the back of a wafer. The result is that the contact thermal resistance was increased to $10^2$ deg·cm$^2$/W. This means that, even if the temperature of the wafer chuck is constant, the application of energy of 100 mW/cm$^2$ to a wafer in the X-ray exposure, for example, causes a temperature rise in the wafer by a few degrees. Since the temperature rise in the wafer causes a temperature rise in the mask, there is a possibility of thermal distortion of the latter which results in positional deviation of a pattern.

SUMMARY OF THE INVENTION

It is accordingly an object of the present invention to provide a substrate holding device in which the temperature of a substrate, being held by the substrate holding device, can be controlled precisely.

It is another object of the present invention to provide a substrate holding device suitably applicable to an exposure apparatus for manufacture of semiconductor microcircuits, wherein a semiconductor substrate is held at an exposure position through a difference between pressures applied respectively to both sides of the substrate and wherein any temperature rise in the substrate which otherwise might be caused by the exposure operation can be reduced.

It is a further object of the present invention to provide an exposure apparatus by which, through the control of the temperature of a wafer chuck, holding a wafer, any temperature rise in a mask and a wafer which otherwise might be caused by the exposure operation can be reduced, whereby correct transfer of a pattern of the mask to the wafer is ensured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Before explaining the operation of the present invention, the temperature rise in a mask during exposure will first be described.

Figure 1:
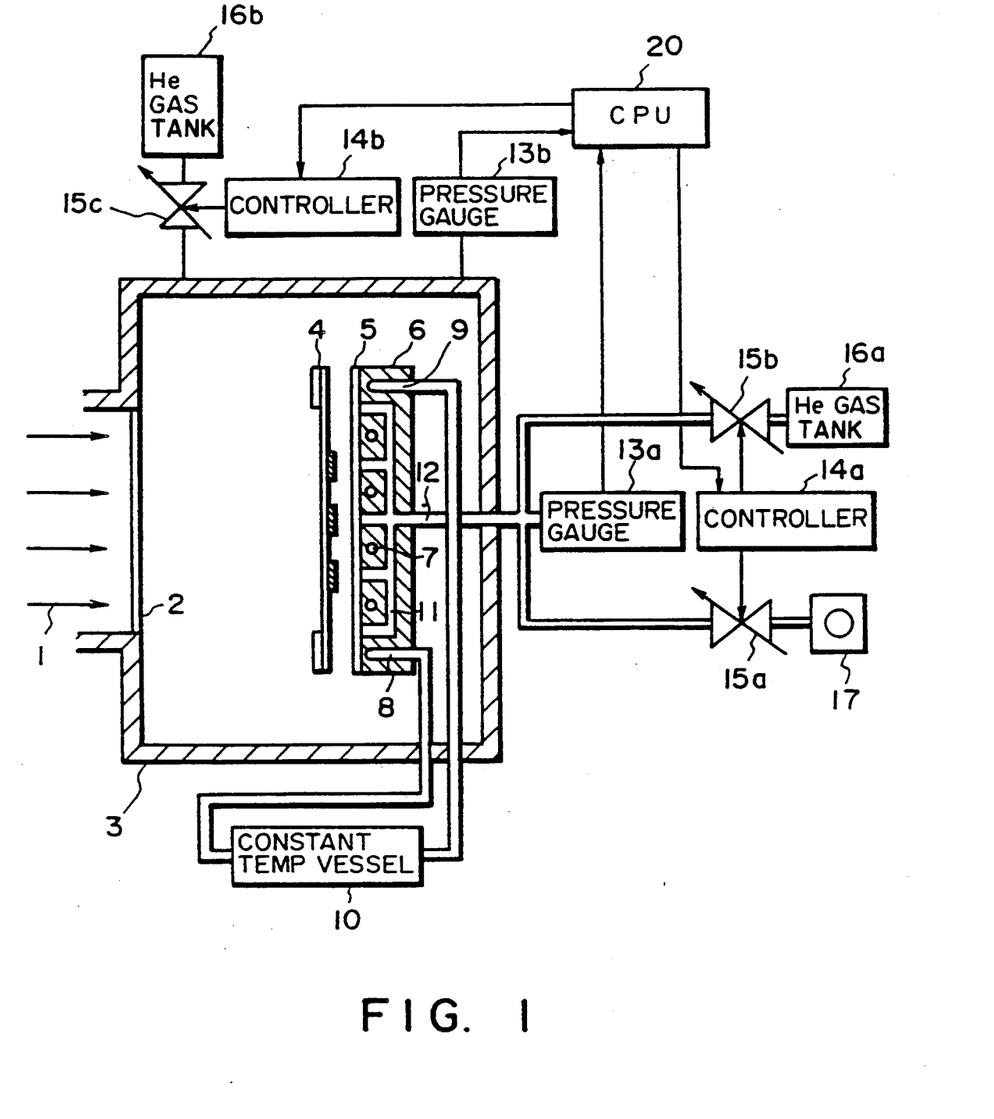
FIG. 1 is a schematic and diagrammatic view of an exposure apparatus with a substrate holding device, according to an embodiment of the present invention.
Figure 2A:
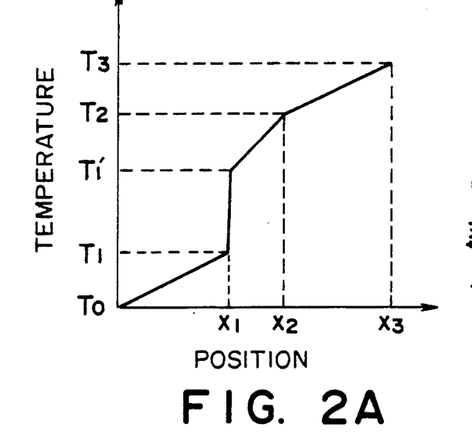
FIGS. 2A and 2B are a graph and a schematic representation, illustrating temperatures at different sites about a wafer, as assumed during the exposure operation.
Figure 2B:
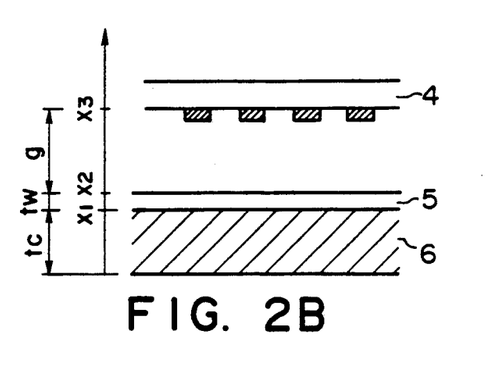

If in FIG. 1, the back of the wafer chuck 6 is maintained at a certain temperature $T_0$ by means of constant temperature circulating water, at different sites $x_0$–$x_3$ such as shown in FIG. 2B, the temperatures are such as shown in FIG. 2A wherein the axis of the abscissa denotes the position x while the axis of the ordinate denotes the temperature. As regards the position x, as seen in FIG. 2B, a predetermined position on the constant temperature water side (back face) of the wafer chuck 6 is taken as an origin and, along the direction of irradiation of exposure energy (X-rays 1) to a mask 4 and a wafer 5, the interface between the wafer chuck 6 and the wafer 5 is denoted by $x_1$, the front face of the wafer 5 is denoted by $x_2$ and the position of the mask substrate 4 is denoted by $x_3$. As seen in FIG. 2A, at the interface $x_1$ between the wafer 5 and the wafer chuck 6, there is an interruption in the temperature. This is because of the presence of the contact thermal resistance between the wafer 5 and the wafer chuck 6.

The temperature rise $\Delta T$ ($=T_3-T_0$) in the mask 4 being exposed with the X-rays 1, for example, is given by the following equation:

$$\Delta T = (tc/\lambda c + R + tw/\lambda w + g/\lambda g) Qt \quad \ldots \quad (1)$$

where tc is the thickness of the wafer chuck 6 with respect to the direction of irradiation, $\lambda c$ is the heat conductivity of the wafer chuck, tw is the thickness of the wafer 5 with respect to the direction of irradiation, $\lambda w$ is the heat conductivity of the wafer, g is the proximity gap between the mask 4 and the wafer 5 with respect to the direction of irradiation, $\lambda g$ is the heat conductivity of the gas in the proximity gap, and R is the contact thermal resistance between the wafer chuck 6 and the wafer 5. Also, Qt is the strength of the X-rays 1 (FIG. 1) as projected to the mask 4 per unit time and unit area. The thermal distortion $\Delta l$ of the mask 4 resulting from the temperature rise can be expressed by using a linear expansion coefficient $\alpha$ and the exposure view angle 21 (which corresponds to the range for the pattern of the mask 4 to be transferred to the wafer), in the following manner:

$$\Delta l = l \cdot \alpha \Delta T \ldots \quad (2)$$

Here, using a silicon nitride ($Si_3N_4$) mask having a linear expansion coefficient $\alpha$ ($\alpha = 2.7 \times 10^{-6}$ [1/deg]) and a view angle 30 mm ($l = 15$ mm in a He gas ambience and under the conditions shown in Table 1, below, the thermal distortion in the exposure will now be considered.

TABLE 1

| Proximity Gap | g = 10 microns |
|---|---|
| Wafer Chuck (material: SUS) | $\lambda c$ = 0.245 [W/cm · deg] |
| | tc = 0.2 cm |
| Si Wafer | $\lambda w$ = 0.84 [W/cm · deg] |
| | tw = 0.05 cm |
| X-ray Strength | Qt = 0.1 [W/cm$^2$] |

Figure 3:
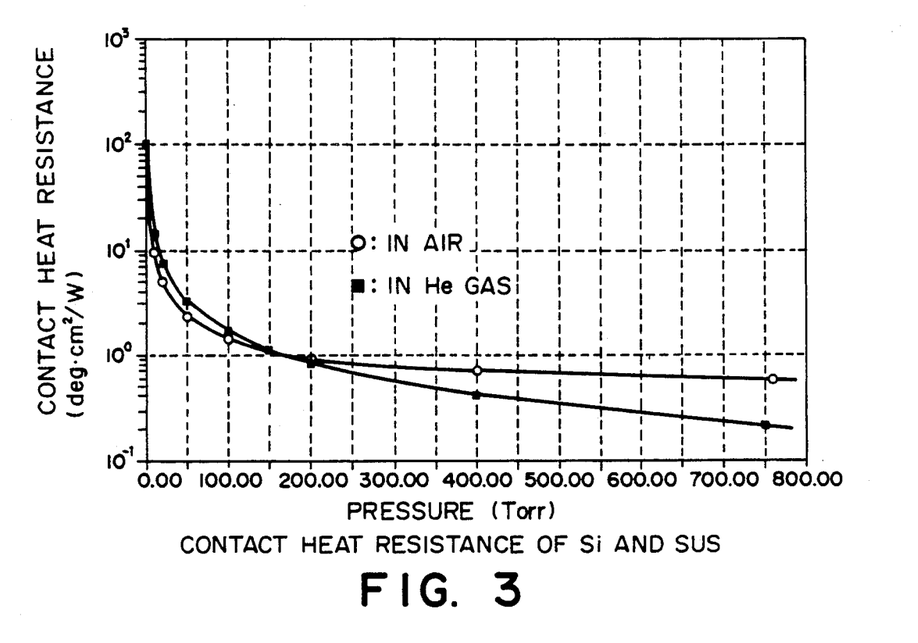
FIG. 3 is a graph showing the relationship between the contact thermal resistance and the pressure.

First, by using FIG. 3, a temperature rise $\Delta T$ on an occasion when the interspace between the wafer chuck 6 and the wafer 5 is uncontrollably evacuated as in the FIG. 5 example, will be determined. FIG. 3 illustrates the contact thermal resistance on an occasion when He gas or air is confined within a small interspace between the wafer 5 and the wafer chuck 6 (substrate holding table), wherein the axis of the abscissa denotes the pressure in the small interspace while the axis of the ordinate denotes the contact thermal resistance. In this case, the pressure difference between both sides of the wafer 5 produced by the vacuum supplied to the wafer chuck 6 is set to be equal to 150 Torr. It is seen in FIG. 5 that, when the minute space between the wafer chuck and the wafer is maintained at complete vacuum, the contact thermal resistance R is equal to $10^2$ Kcm$^2$/W. When this value and the exposure conditions mentioned above are substituted into equation (1), then the following results:

$$\Delta T \approx 10 \text{ (deg)}$$

Accordingly, from equation (2), the thermal distortion $\Delta l$ is 0.81 micron. It is considered that the maximum tolerable thermal distortion is 0.025 micron when the alignment precision is 0.06 micron, and the aforementioned value is extraordinarily greater than this.

Next, description will be made of the principle of operation of the present invention. According to the present invention, for exposure of a mask 4 and a wafer 5, as seen in FIG. 1, the gas in a reduced pressure duct 11 is drawn by a drawing pump 17, such that the pressure in the clearance between the wafer 5 and the wafer chuck 6 is reduced. This produces a pressure difference between both sides of the wafer 5, by which the wafer 5 is attracted to and held on the wafer chuck 6. In this instance, the pressure in the reduced pressure duct 11 is controlled on the basis of the measurement through a pressure gauge 13a so as to maintain the contact thermal resistance between the wafer 5 and the wafer chuck 6 at a predetermined value.

Such a predetermined value for the contact thermal resistance is set to ensure that the heat in the wafer 5 is discharged to prevent a temperature rise of the wafer 5 thereby avoiding a avoid temperature rise in the mask 4, such that the pattern of the mask 4 can be printed on the wafer 5 correctly. The contact thermal resistance R can be written from the thermal distortion tolerance $\Delta l_0$ and from equations (1) and (2), as follows:

$$R \leq (\Delta l_0)/(l \cdot \alpha) \cdot 1/Qt - (tc/\lambda c + tw/\lambda w + g/\lambda g) \quad \ldots (3)$$

Substituting the exposure conditions set forth in Table 1 into equation (3), it follows that:

$$R \leq 4.6 \text{ [deg·cm}^2\text{/W]}$$

It is seen from FIG. 3 that the pressure in the clearance between the wafer 5 and the wafer chuck 6 which produces contact thermal resistance R of not greater than 4.6 (deg·cm$^2$/W), is approximately not less than 50 Torr.

As described, in the present invention, the pressure in the space between the wafer chuck 6 and the bottom surface of the wafer 5 is not uncontrollably evacuated by a pump but, rather, a particular pressure that does not produce a large contact thermal resistance, causing inconveniences, is retained controllably. Such a pressure can vary depending on the exposure conditions. For example, if the proximity gap of the exposure conditions in Table 1 is 50 microns, then $R \leq 1.01$ [deg·cm$^2$/W] and, thus, the pressure should be not less than 200 Torr. It is to be noted here that the pressure difference between both sides of the wafer 5 has to be sufficient for the holding of the wafer 5 by the wafer chuck 6 and, to this end, the pressure to be applied to the front surface of the wafer is controlled as required, simultaneously with the control of the pressure in the reduced pressure duct 11 of the wafer chuck 6. Approximately, a pressure difference not less than 100-150 Torr is necessary.

Referring back to FIG. 1, there is shown an X-ray exposure apparatus to which an embodiment of the present invention is applied. In FIG. 1, denoted at 1 are X-rays as produced by an accumulating ring or the like, not shown; at 3 is a chamber the inside of which is occupied by a gas such as He, for example, transmissive to the X-rays 1, wherein the X-rays 1 pass through a beryllium (Be) window 2 and enter into the chamber 3; at 4 is a mask; at 5 is a wafer onto which a pattern formed on the mask 4 is to be printed through the exposure to the X-rays 1; at 6 is a wafer chuck for holding the wafer 5 by attraction; at 7 is a passageway which is formed in the wafer chuck 6 and through which constant temperature water circulates to maintain the temperature of the wafer chuck 6 constant. The passageway 7 communicates with an outlet port 9 from which the constant temperature water flows into a constant temperature vessel 10 and, after being adjusted to a predetermined temperature, the water flows again into the passageway 7 from an inlet port 8. By this circulation, the wafer chuck 6 can be maintained at a constant temperature. Further, the wafer chuck 6 is provided with a reduced pressure duct 11 the holding the wafer 5. The reduced pressure duct 11 communicates with a pressure gauge 13a through a drawing duct 12 and, also, the reduced pressure duct communicates with a vacuum supplying pump 17 and a He gas supplying tank 16a through gas adjusting valves 15a and 15b, respectively. The quantity of gas supply to the reduced pressure duct 11 can be determined by the degree of opening/closing of each of the adjusting valves 15a and 15b. A signal corresponding to a pressure value measured by the pressure gauge 13a is applied to a central processing unit (CPU) 20. On the basis of the signal from the controller 14a, in response to which the controller 14a controls the opening/closing of the gas adjusting valves 15a and 15b, by which the pressure in the reduced pressure duct 11 can be maintained at a predetermined value (for example, 50 Torr). Namely, the contact thermal resistance between the wafer 5 and the wafer chuck 6 is maintained at a desired value. Similarly, the He gas pressure in the chamber 3 is maintained constant by controlling the opening/closing of the gas adjusting valve 15c through the controller 14b in response to a signal from another pressure gauge 13b, measuring the pressure within the chamber 3, applied to the CPU 20, namely, by controlling the quantity of the He gas supplied to the chamber 3 from the tank 16b.

In this embodiment, first the CPU 20 calculates and determines the pressure to be established in the reduced pressure duct 11 on the basis of various data, such as those shown in Table 1 and FIG. 3, as inputted into a memory of the CPU 20 beforehand, and on of the three equations mentioned above. It is to be noted that those data based on the specification of the exposure apparatus and the state of exposure, necessary for these three equations for calculation of the contract thermal resistance R, are inputted into the CPU 20 beforehand. The pressure in the reduced pressure duct 11 is different, depending on the pressure difference between both sides of the wafer 5 and the material of the wafer chuck 6. For example, if the pressure difference is 150 Torr and the wafer chuck 6 is made of an SUS material, from FIG. 3 the pressure to be provided in the reduced pressure duct 11 is determined to be equal to about 50 Torr, and the gas adjusting valves 15a and 15b are opened/closed so as to maintain the determined pressure.

The He gas pressure in the chamber 3 is determined to be equal to 200 Torr which corresponds to the sum of the pressure of 50 Torr in the reduced pressure duct 11 and the pressure difference of 150 Torr for the holding of the wafer 5. Similar to the pressure control of the reduced pressure duct 11, the He gas pressure is controlled to be maintained at the determined pressure, by means of the gas adjusting valve 15c.

As regards the contact thermal resistance R, there are cases wherein the resistance changes not only with the pressure Pn of the gas in the reduced pressure duct 11 but also with the flatness of the wafer 5 and/or the material of the wafer chuck 6. Further, since the contact thermal resistance R to be set changes with the strength of the X-rays 1 or the like, also in this respect, it is necessary to adjust the pressure Pn of the reduced pressure duct 11. When the pressure Pn of the reduced pressure duct 11 is changed in accordance with the conditions and if the pressure difference Pw for the holding of the wafer 5 by the wafer chuck 6 is to be unchanged, the ambience pressure Pc ($=Pn+Pw$) in the chamber 3 changes with the change in the pressure Pn.

However, if the pressure Pc in the chamber 3 changes, the transmission factor to the X-rays 1 passing therethrough changes. Thus, there is a possibility that a desired exposure amount is not obtained at the time of exposure of the wafer 5 to the mask 4. In order to avoid this, the following two methods may be adopted.

(1) The first is that: the exposure time of the mask 4 and the wafer 5 to the X-rays 1 is changed in accordance with the X-ray transmission factor or the pressure Pc in the chamber 3 as measured by the pressure gauge 13b. The exposure time can be changed by means of a shutter (not shown), for example, provided at an upstream side of the mask 4.

(2) The second is that: when a maximum of the pressure Pn to be established in the reduced pressure duct 11 in accordance with various exposure conditions is denoted by $P_{(n-Mx)}$, the pressure Pc in the chamber 3 is set so as to satisfy the following relation:

$$Pc = Pw + P_{(n-Mx)} \text{ or } Pc > Pw + P_{(h-Mx)}$$

If this is done, the pressure Pc in the chamber 3 can be maintained constant even if the pressure Pn of the reduced pressure duct 11 changes with the exposure conditions. As a result, a desired exposure amount is always obtainable.

Figure 4:
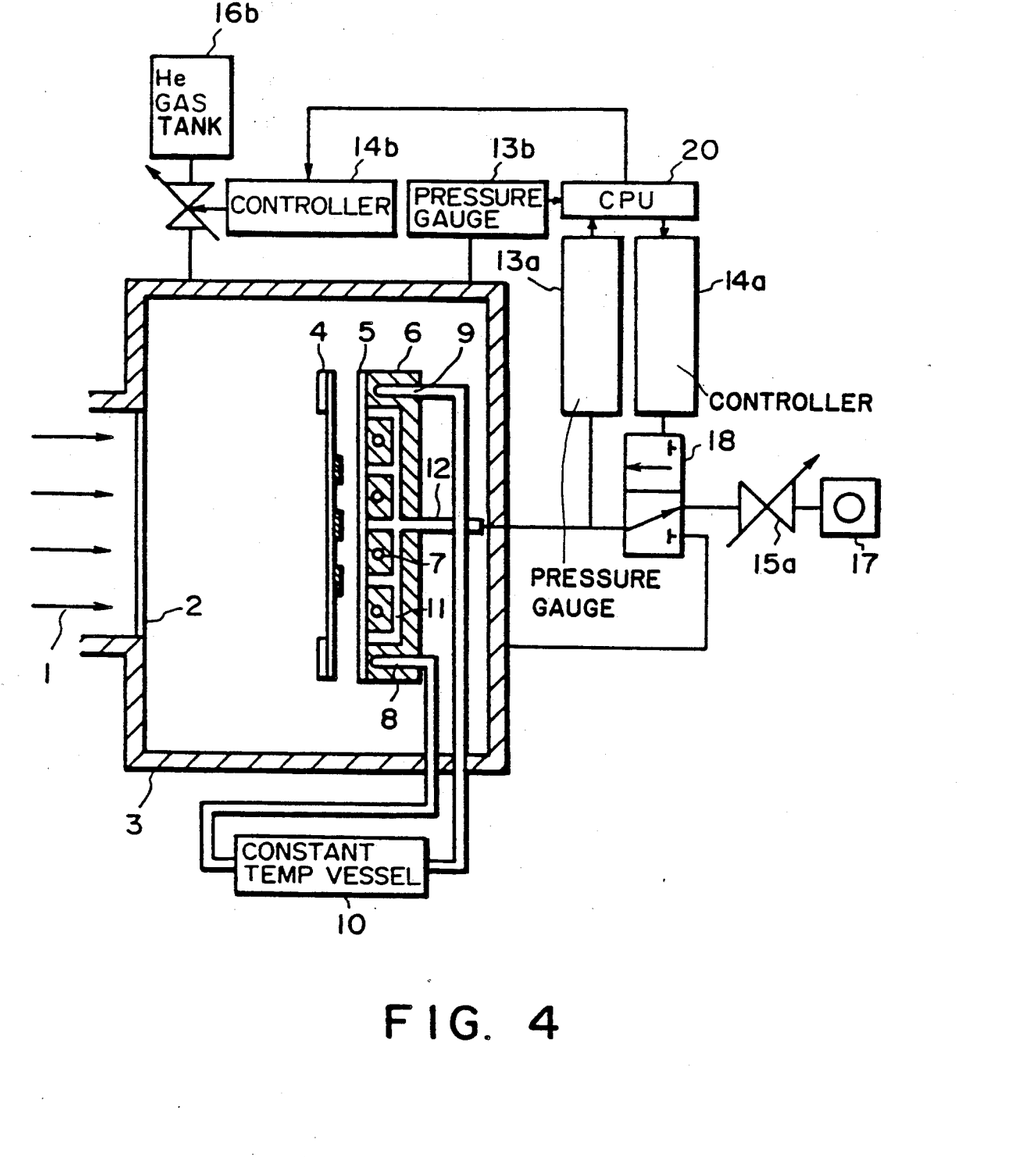
FIG. 4 is a schematic and diagrammatic view of an exposure apparatus with a substrate holding device, according to another embodiment of the present invention.

It will be understood from the foregoing that an important feature of the present invention resides in that a gas which serves as a heat conducting medium is present between the wafer 5 and the wafer chuck 6, at a predetermined pressure. Thus, the He tank 16a in FIG. 1 is not always necessary. The structure may be modified such as shown in FIG. 4, for example, wherein the drawing duct 12 is coupled to a switching valve 18, a gas adjusting valve 15a and a pump 17 in this order, such that by increasing the restriction conductance of the gas adjusting valve 15a, the pressure in the reduced pressure duct 11 is maintained at a desired value. In this example, by switching the valve 18, the reduced pressure duct 11 can be communicated with the chamber 3 whereby the reduced pressure duct 11 and the chamber 3 can be maintained at the same pressure. Thus, the wafer 5 can be easily unloaded from the wafer chuck 6.

Also, while in the above-described embodiment the pressure gauge 13a for measurement of the pressure (vacuum level) of the reduced pressure duct 11 is coupled to the conduit 12 for the gas supplying system or the gas discharging system, the piping for the pressure gauge 13a may be separated from the conduit 12, such that the pressure in the reduced pressure duct 11 may be measured without intervention of the conduit 12. On that occasion, the pressure gauge 13a can measure the pressure of the reduced pressure duct 11 without being affected by the conductance of the conduit 12, for example, and therefore, a more accurate measurement is possible.

Further, it is not necessary that the pressure in the chamber 3 is maintained at a reduced pressure of 200

Torr as mentioned hereinbefore. It is sufficient that the pressure difference between both sides of the wafer 5 is enough to hold the wafer 5. Thus, the pressure may be equal to or higher than the atmospheric pressure.

While, in the foregoing, description has been made of an example wherein the invention is applied to an exposure apparatus, the applicability of the invention is not limited to such field. Rather, the invention is widely applicable to various apparatuses wherein a sample is to be maintained at a constant temperature and wherein the sample is to be held by using an attracting force resulting from a pressure difference produced between both sides of the sample.

In accordance with the present invention, as described hereinbefore, the pressure in the space between a bottom surface of a substrate and a substrate holding table is not uncontrollably evacuated but, rather, a particular pressure that does not produce a large contact thermal resistance, causing various inconveniences, is positively and controllably retained. As a result, it is possible to suppress a temperature rise of the substrate.

While the invention has been described wit reference to the structures disclosed herein, it is not confined to the details set forth and this application is intended to cover such modifications or changes as may come within the purposes of the improvements or the scope of the following claims.

What is claimed is:

1. A substrate holding device for holding a substrate for exposure thereof with radiation, said apparatus comprising:
   a holding table including a reduced pressure passageway;
   a pressure gauge for measuring a value related to the pressure in said reduced pressure passageway;
   a pump for producing a pressure difference between a first surface of the substrate to be attracted to said holding table and a second surface of the substrate not to be attracted to said holding table;
   a valve which can be opened/closed for control of the pressure in said reduced pressure passageway;
   pressure control means for controlling the opening/closing of said valve during exposure of the substrate with radiation, on the basis of an output corresponding to the valve measured by said pressure gauge, such that the substrate is held on said holding table during the exposure by a controlled pressure difference; and
   temperature control means for controlling the temperature of said holding table.

2. A device according to claim 1, wherein said temperature control means supplies constant temperature water to said holding table.

3. A device according to claim 1, wherein said pressure control means controls said valve so as to provide a predetermined contact thermal resistance between the substrate and said holding table.

4. A substrate holding device for holding a substrate for exposure thereof with radiation, said apparatus comprising:
   a holding table including a reduced pressure passageway;
   a pressure gauge for measuring a value related to the pressure in said reduced pressure passageway;
   a pump for producing a pressure difference between a first surface of the substrate to be attracted to said holding table and a second surface of the substrate not to be attracted to said holding table;
   a tank for containing gas to be supplied to said reduced pressure passageway;
   a first valve provided between said reduced pressure passageway and said pump;
   a second valve provided between said reduced pressure passageway and said tank; and
   pressure control means for controlling opening/closing of said first and second valves during exposure of the substrate with the radiation, on the basis of an output corresponding to the value measured by said pressure gauge, so as to provide a predetermined pressure in said reduced pressure passageway, such that the substrate is held on said holding table during exposure by a controlled pressure difference.

5. A device according to claim 4, wherein said pressure control means controls said first and second valves so as to provide a predetermined contact thermal resistance between the substrate and said holding table.

6. A substrate holding device for holding a substrate for exposure thereof with radiation, said apparatus comprising:
   a holding table including a reduced pressure passageway;
   a pressure gauge for measuring a value related to the pressure in said reduced pressure passageway;
   a pump for producing a pressure difference between a first surface of the substrate to be attracted to said holding table and a second surface of the substrate not to be attracted to said holding table;
   a valve which can be opened/closed for control of the pressure in said reduced pressure passageway; and
   pressure control means for controlling the opening/closing of said valve during the exposure of the substrate with the radiation, on the basis of an output corresponding to the value measured by said pressure gauge, so as to provide a predetermined pressure in said reduced pressure passageway, such that the substrate is held on said holding table during the exposure by a controlled pressure difference.

7. A substrate holding device for holding a substrate for exposure thereof with radiation, said apparatus comprising:
   a holding table including a reduced pressure passageway;
   a pressure gauge for measuring a value related to the pressure in said reduced pressure passageway;
   a pump for producing a pressure difference between a first surface of the substrate to be attracted to said holding table and a second surface of the substrate not to be attracted to said holding table;
   a valve which can be opened/closed for control of the pressure in said reduced pressure passageway; and
   pressure control means for controlling the opening/closing of said valve during the exposure of the substrate with the radiation, on the basis of an output corresponding to the value measured by said pressure gauge, such that the substrate is held on said holding table during the exposure by a controlled pressure difference and with a predetermined contact thermal resistance between the substrate and said holding table.

8. A device for holding a substrate on which a pattern formed on an original is to be printed by exposure of the substrate with radiation, said device comprising:

a holding table including a reduced pressure passageway;

a pressure gauge for measuring a value related to the pressure in said reduced pressure passageway;

pressure difference producing means for producing a pressure difference between a first surface of the substrate to be attracted to said holding table and a second surface of the substrate not to be attracted to said holding table;

pressure control means for controlling the pressure in said reduced pressure passageway during the exposure of the substrate with the radiation, on the basis of an output corresponding to the value measured by said pressure gauge, such that the substrate is held on said holding table during the exposure by a controlled pressure difference; and temperature control means for controlling the temperature of said holding table.

9. A device according to claim 8, wherein said temperature control means controls the temperature of each of the original and the substrate, through said holding table.

10. A device according to claim 8, wherein said pressure control means controls the pressure in said reduced pressure passageway so as to provide a predetermined contact thermal resistance between the substrate and said holding table.

11. A device according to claim 8, further comprising a chamber for surrounding the original and the substrate with a predetermined ambience.

12. A device according to claim 8, wherein said device is used with an exposure apparatus having a chamber, for exposing the original and the substrate with radiation, and wherein said holding table is accommodated in the chamber.

13. An exposure apparatus for exposing a substrate with radiation to form a pattern on the substrate, said apparatus comprising:

a holding table for holding the substrate thereon, said holding table including a reduced-pressure passageway;

exposing means for exposing the substrate, held by said holding table, with radiation;

a chamber for surrounding said holding table with a predetermined reduced-pressure ambience;

a pressure gauge for measuring a level related to the pressure in said reduced-pressure passageway;

pump means for producing through said reduced-pressure passageway a pressure difference between a first surface of the substrate facing said holding table and a second surface on the opposite side of the substrate, such that the substrate is held on said holding table by the produced pressure difference;

valve means to be opened/closed for control of the pressure in said reduced-pressure passageway; and control means for controlling the opening/closing of said valve means during exposure of the substrate with radiation on the basis of the measurement by said pressure gauge, such that during exposure of the substrate with the radiation the substrate is held on said holding table with a controlled pressure difference and with a controlled contact thermal resistance between the substrate and said holding table.

14. An apparatus according to claim 13, further comprising temperature controlling means for controlling the temperature of said holding table.

15. A method of exposing a substrate with radiation to form a pattern on the substrate, said method comprising the steps of:

placing the substrate on a holding table in a chamber;

applying pressure to one of a first surface of the substrate placed on the holding table facing the holding table and a second surface of the substrate opposite the first surface, through a passageway with valve means so as to produce a pressure difference between the first surface and the second surface of the substrate;

measuring a level related to the pressure in the passageway;

exposing the substrate on the holding table with radiation to form the pattern on the substrate; and controlling, during the exposure of the substrate, the opening/closing of the passageway by the valve means on the basis of the measured level so as to control the pressure difference between the first surface and the second surface of the substrate to continuously hold the substrate during the exposure by a controlled pressure difference between the first and second surfaces and with a controlled contact thermal resistance between the substrate and the holding table.

16. A method according to claim 15, further comprising holding the substrate on the holding table only by the controlled pressure difference during the exposure.

* * * * *

UNITED STATES PATENT AND TRADEMARK OFFICE
CERTIFICATE OF CORRECTION

PATENT NO. : 5,093,579
DATED : March 3, 1992
INVENTOR(S) : Mitsuaki Amemiya, et al.

It is certified that error appears in the above-identified patent and that said Letters Patent is hereby corrected as shown below:

COLUMN 3

Line 32, "mm" should read --mm)--.

COLUMN 4

Line 20, "avoid" should be deleted.

COLUMN 5

Line 11, "11" should read --11 for holding--;
Line 22, "the con-" should read --the pressure gauge 13a, the CPU 20 supplies a signal to a con- --;
Line 40, "on" should read --on the basis--; and
Line 45, "contract" should read --contact--.

COLUMN 7

Line 22, "wit" should read --with--; and
Line 45, "valve" should read --value--.

Signed and Sealed this

Fourteenth Day of September, 1993

Attest:

BRUCE LEHMAN

Attesting Officer

Commissioner of Patents and Trademarks